(12) United States Patent  
Somei et al.

(10) Patent No.: US 9,190,220 B2  
(45) Date of Patent: Nov. 17, 2015

(54) DYE-SENSITIZED SOLAR CELL

(71) Applicant: TAIYO YUDEN CO., LTD., Taito-ku, Tokyo (JP)

(72) Inventors: Hidenori Somei, Tokyo (JP); Kenichi Ota, Takasaki (JP)

(73) Assignee: TAIYO YUDEN CO., LTD., Tokyo (JP)

(*) Notice: Subject to any disclaimer, the term of this patent is extended or adjusted under 35 U.S.C. 154(b) by 170 days.

(21) Appl. No.: 14/037,232

(22) Filed: Sep. 25, 2013

(65) Prior Publication Data

US 2014/0090703 A1    Apr. 3, 2014

(30) Foreign Application Priority Data

Oct. 1, 2012    (JP) .................................. 2012-219523

(51) Int. Cl.
*H01G 9/20* (2006.01)
*H01L 31/05* (2014.01)
*H01L 51/44* (2006.01)

(52) U.S. Cl.
CPC ............ *H01G 9/2081* (2013.01); *H01L 51/445* (2013.01); *H01G 9/2031* (2013.01); *H01G 9/2059* (2013.01); *H01L 31/0508* (2013.01); *Y02E 10/542* (2013.01)

(58) Field of Classification Search
CPC .................................................. H01L 51/0445
See application file for complete search history.

(56) References Cited

U.S. PATENT DOCUMENTS

2010/0108135 A1    5/2010    Morooka et al.

FOREIGN PATENT DOCUMENTS

| JP | 2005141996 | A | * | 6/2005 | |
|---|---|---|---|---|---|
| JP | 2006-134870 | A | | 5/2006 | |
| JP | 2009-110796 | A | | 5/2009 | |
| JP | 2009-238583 | A | | 10/2009 | |
| JP | 2010-218948 | A | | 9/2010 | |
| JP | 2012-079428 | A | | 4/2012 | |
| JP | 2012134451 | A | * | 7/2012 | ............ Y02E 10/542 |

OTHER PUBLICATIONS

Machine translation of JP2012-079428A.*
Machine translation of JP2012-134451A.*
Machine translation of JP2005-141996A.*
A Notice of Reasons for Refusal issued by Japanese Patent Office, mailed Aug. 26, 2014, for Japanese counterpart application No. 2012-219523.

* cited by examiner

*Primary Examiner* — Christina Chern
*Assistant Examiner* — Eric R Smith
(74) *Attorney, Agent, or Firm* — Law Office of Katsuhiro Arai (57) ABSTRACT

A dye-sensitized solar cell includes four generation cells, wherein their negative electrodes and positive electrodes are facing each other, with an electrolytic solution sealed in between, and being contacted by generation layers. On the other main side of a polyimide layer on which the positive electrodes are formed, wiring layers corresponding to the positive electrodes are provided in positions overlapping with both the corresponding positive electrodes and the positive electrodes adjacent thereto. The wiring layers corresponding to the positive electrodes are connected by through holes and conductor penetrating the polyimide layer. The negative electrodes of the generation cells are connected, on the outer periphery side, with the wiring layers that are connected to the positive electrodes of the adjacent generation cells, except for the wiring layer and negative electrode on which leader terminal parts are formed.

20 Claims, 8 Drawing Sheets

DYE-SENSITIZED SOLAR CELL

BACKGROUND

1. Field of the Invention

The present invention relates to a dye-sensitized solar cell, and more specifically to an output voltage control.

2. Description of the Related Art

Dye-sensitized solar cells (hereinafter referred to as "DSC") are each structured in such a way that a generation electrode (negative electrode) that forms a semiconductor layer (generation layer) on which a sensitizing dye is supported is arranged to face an opposing electrode (positive electrode) that forms a catalyst metal, with an electrolyte-containing electrolytic solution contained between the opposing electrodes. When light is irradiated on to the DSC, the dye adsorbed to titanium oxide that constitutes the generation layer is electronically excited and the excited electrons are injected into the conductor of titanium oxide, and consequently the electrons migrate from titanium oxide to a clear conductive film of ITO or FTO and can be removed as electrical current. If there is only one dye-sensitized solar cell, however, the output voltage is 0.7 V at the maximum and accordingly the voltage must be stepped up using a step-up circuit, etc., before the solar cell can be connected to and used with electrical equipment.

To solve the aforementioned problem, for example, Patent Literature 1 specified below discloses technology whereby a pseudo-module is prepared as a structure comprising two adjacent dye-sensitized photoelectric conversion elements, where a clear conductive layer on one dye-sensitized photoelectric conversion element is electrically connected to a counter electrode on the other dye-sensitized photoelectric conversion element in the space provided between the elements.

BACKGROUND ART LITERATURES

[Patent Literature 1] Japanese Patent Laid-open No. 2009-110796

SUMMARY

However, while a conductive material is used in Patent Literature 1 mentioned above to electrically connect the two adjacent dye-sensitized photoelectric conversion elements in the gap provided in between, presence of a metal-corroding electrolytic solution nearby makes it necessary to select a material exhibiting high corrosion resistance and high oxidization resistance. Since any material exhibiting high corrosion resistance and high oxidization resistance generally has high resistivity, there is a problem that the output voltage of the cell and that of the entire pseudo-module become lower.

The present invention was developed by focusing on the point mentioned above and an object of the present invention is to provide a dye-sensitized solar cell having an electrode connection structure where a low-resistance conductive material is used to keep the output voltage of the cell or entire module high.

The present invention provides a dye-sensitized solar cell having multiple photoelectric conversion elements, where each element has a negative electrode on which a dye-sensitized generation layer is provided, as well as a positive electrode opposingly positioned in a manner sandwiching the generation layer, and an electrolytic solution is sealed in the space formed by a sealant provided around the negative electrode and positive electrode; wherein such dye-sensitized solar cell is characterized in that: the multiple photoelectric conversion elements are positioned around the dye-sensitized solar cell except at its approximate center; multiple wiring layers corresponding to the positive electrodes of multiple photoelectric conversion elements are positioned, via an insulation layer, on the non-optical receiving side of the dye-sensitized solar cell; and the dye-sensitized solar cell comprises: a negative electrode terminal part which is connected to the negative electrode of one of the multiple photoelectric conversion elements and used for taking out the electrodes at the approximate center; a first electrode coupling means for electrically connecting the positive electrode and corresponding wiring layer; a positive electrode terminal part which is formed on the wiring layer connected to the positive electrode of another element among the multiple photoelectric conversion elements other than the one of the multiple photoelectric conversion elements and which is used for taking out the electrodes at the approximate center; and a second electrode coupling means for connecting adjacent photoelectric conversion elements by electrically connecting the negative electrode of an element on which the negative electrode terminal part is not provided, with a wiring layer on which the positive electrode terminal part is not provided, on the outer periphery side of the dye-sensitized solar cell.

One key embodiment is characterized in that: the wiring layer is formed at a position overlapping, via the insulation layer, with both the positive electrode of the corresponding photoelectric conversion element and the positive electrode of another photoelectric conversion element adjacent to the corresponding photoelectric conversion element; the first electrode coupling means is provided in a range where the wiring layer overlaps with the positive electrode of the corresponding photoelectric conversion element; and the second electrode coupling means is connected to the negative electrode of the adjacent photoelectric conversion element, on the outer periphery side, in a range where the wiring layer overlaps with the positive electrode of the adjacent photoelectric conversion element.

Another embodiment is characterized in that the first electrode coupling means is a conductive path formed in a hole that penetrates through the insulation layer from the positive electrode to the wiring layer corresponding to the positive electrode. Yet another embodiment is characterized in that the first electrode coupling means is provided on the outer periphery side of the dye-sensitized solar cell. Yet another embodiment is characterized in that the second electrode coupling means is a conductive path formed by a conductive paste.

Yet another embodiment is characterized in that: the negative electrodes of the multiple photoelectric conversion elements are respectively formed around a first through hole on one main side of an optically transparent board having the first through hole at its approximate center; the insulation layer has, at its approximate center, a second through hole whose diameter is greater than that of the first through hole, where the positive electrodes of the multiple photoelectric conversion elements are respectively formed on one main side, while the multiple wiring layers corresponding to the positive electrodes are formed on the other main side; the peripheries of the first and second through holes are exposed without overlapping with the generation layer, respectively; and the negative electrode terminal part is formed around the first through hole, while the positive electrode terminal part is formed around the second through hole, so that the negative electrodes and positive electrodes are taken out in the same direction from the approximate center.

Yet another embodiment is characterized in that the negative electrode is a net-like electrode. The aforementioned and other objects, characteristics and benefits of the present invention are made clear by the detailed explanations below and the drawings attached hereto.

According to the present invention, in a dye-sensitized solar cell having multiple photoelectric conversion elements, each constituted by a negative electrode on which a generation layer is provided and by an opposing positive electrode, with an electrolytic solution sealed in the space formed by a sealant provided around them, a wiring layer corresponding to the positive electrode is formed on the other main side of the insulation layer on which the positive electrode is formed, so as to connect the positive electrode by the first electrode coupling means. Also, the negative electrode of a photoelectric conversion element, and the wiring layer connected to the positive electrode of an adjacent photoelectric conversion element, are connected by the second electrode coupling means on the outer periphery side of the solar cell. Such electrical connection structure keeps to a minimum any corrosion occurring at the electrically connected part due to leakage of the electrolytic solution, and therefore low resistance can be achieved by implementing electrical connection using a metal that is highly corrosive to iodine contained in the electrolytic solution, and the output voltage of the cell or entire solar cell can be kept high as a result.

Any discussion of problems and solutions involved in the related art has been included in this disclosure solely for the purposes of providing a context for the present invention, and should not be taken as an admission that any or all of the discussion were known at the time the invention was made.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

DESCRIPTION OF THE SYMBOLS

- 10: Solar cell
- 12: Negative electrode board (generation board)
- 14: Board with clear conductive film
- 16: Plastic board
- 18: Clear conductive film
- 18A to 18D: Negative electrode
- 19: Negative electrode terminal part
- 20: Through hole
- 22: Pattern
- 22A: Inner periphery part
- 22B: Radial part
- 24A to 24D: Generation layer
- 26: Sealant
- 26A: Inner periphery part
- 26B: Radial part
- 26C: Outer periphery part
- 28A to 28D: Generation cell
- 30: Positive electrode board (opposing board)
- 31: Printed board
- 32: Polyimide layer
- 34, 40: Thin Cu film
- 36, 42: Thin Au film
- 38, 44: Conductor layer
- 38A to 38D: Positive electrode
- 44A to 44D: Wiring layer
- 45: Positive electrode terminal part
- 46: Through hole
- 48, 50: Pattern
- 48A, 50A: Inner periphery part
- 48B, 50B: Radial part
- 48C: Outer periphery part
- 52A to 52D: Through hole
- 54: Conductor
- 55A to 55D: Catalyst layer
- 56A to 56D: Thin Ti film
- 58A to 58D: Thin Pt film
- 60, 62: Sealant
- 60A: Inner periphery part
- 60B: Radial part
- 60C: Outer periphery part
- 64: Protective layer
- 66: Opening
- 67: Rim
- 68 to 72: Wiring path (conductive paste)
- 74: Electrolytic solution
- 80: Positive electrode board
- 82: Pattern
- 82A: Inner periphery part
- 82B: Radial part
- 82C: Outer periphery part
- 84A to 84D: Positive electrode
- 88: Pattern
- 88A: Inner periphery part
- 88B: Radial part
- 88C: Outer periphery part
- 90A to 90D: Wiring layer
- 92A to 92C: Leader part
- 94A to 94D: Through hole
- 96: Conductor
- 98A to 98D: Catalyst layer
- 100: Sealant
- 100A: Inner periphery part
- 100B: Radial part
- 100C: Outer periphery part
- 102, 104, 106: Wiring path

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

The best mode for carrying out the present invention is explained in detail using examples which are not intended to limit the present invention. Although the disclosed examples were conducted, the examples are described using a literary style that uses the present tense.

EXAMPLE 1

Figure 1:
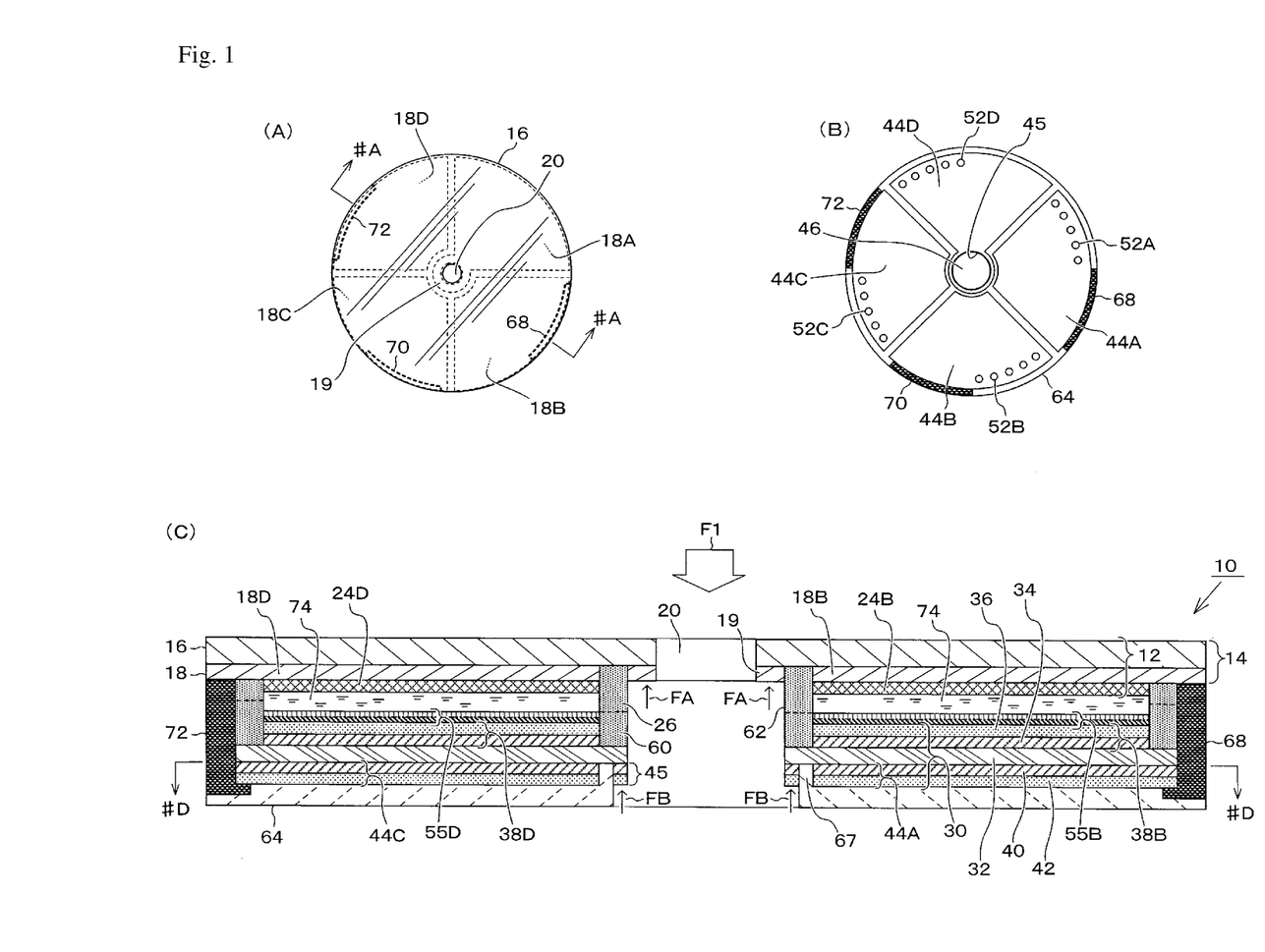
FIG. 1 shows the dye-sensitized solar cell in Example 1 of the present invention, where (A) is a plan view of the entire solar cell as viewed from the optical incidence plane side, (B) is a see-through plan view of the wiring layer side of the positive electrode board as viewed from the optical incidence plane side, and (C) is a section view of (A) above, taken along line #A-#A.
Figure 2:
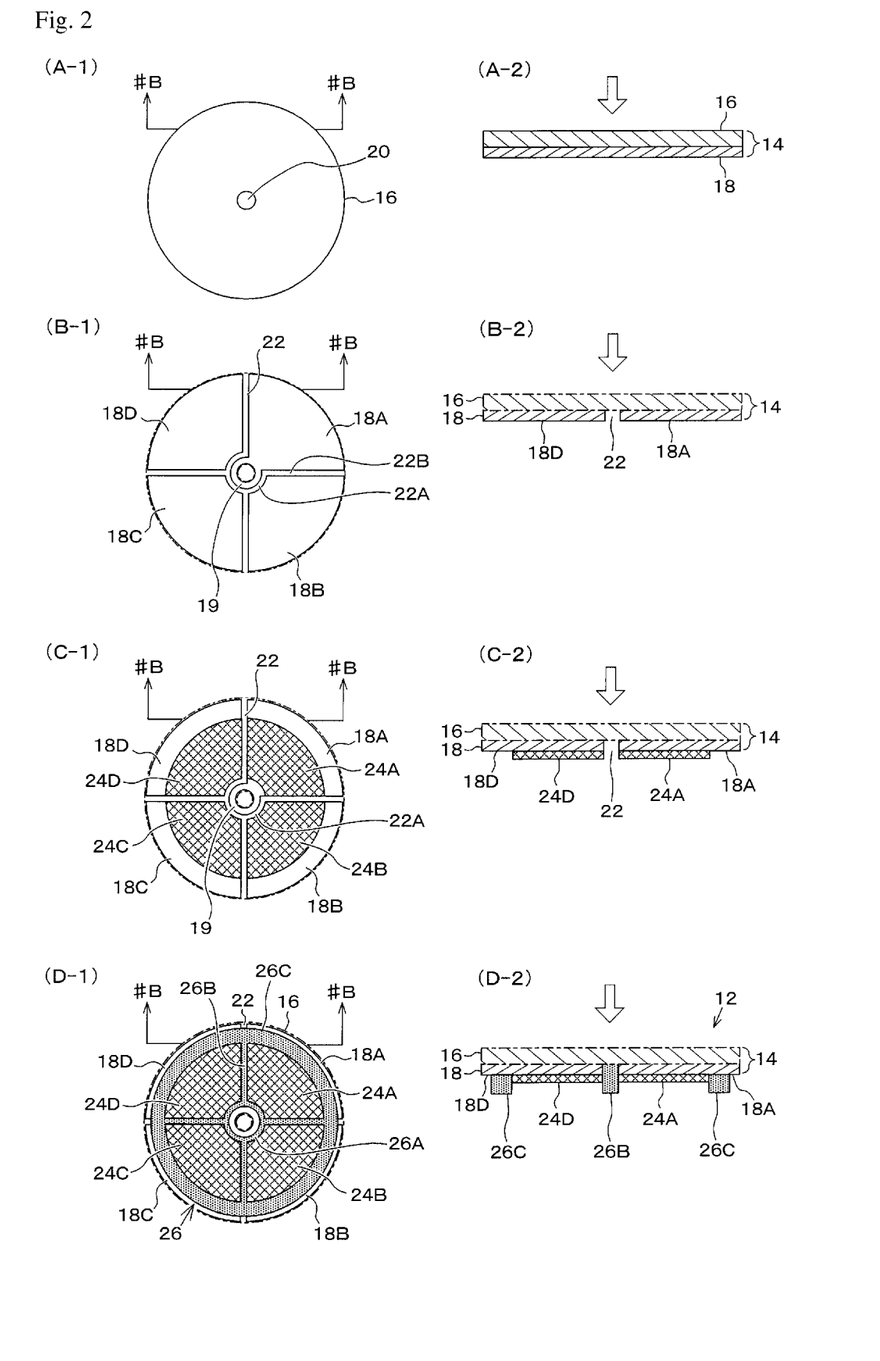
FIG. 2 shows the dye-sensitized solar cell in Example 1, wherein (A-1) to (D-1) are see-through plan views of the plastic board being produced, as viewed from the optical incidence side, (A-2) to (D-2) are section views of the negative electrode board as a whole, corresponding to (A-1) to (D-1) taken along line #B-#B.
Figure 3:
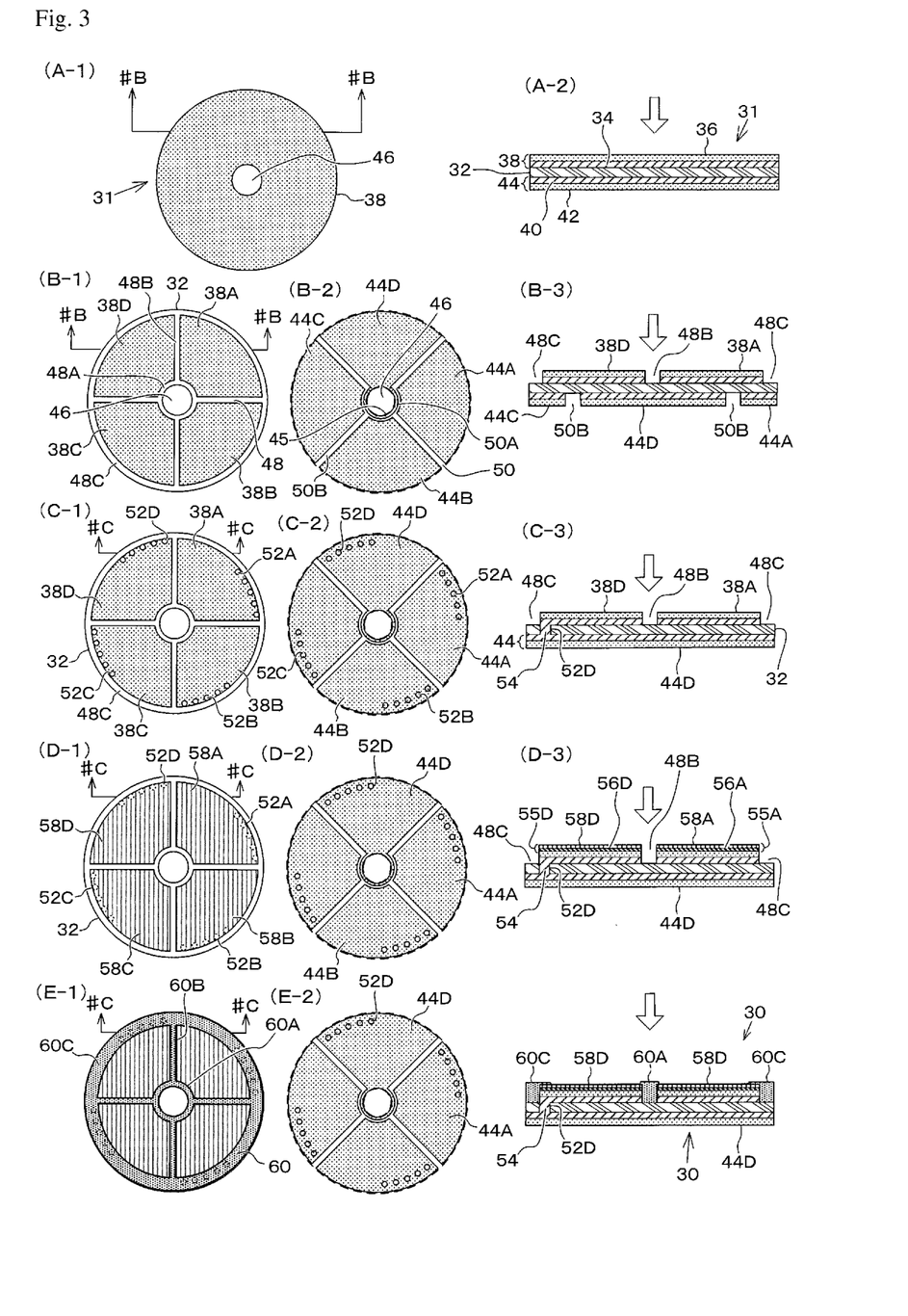
FIG. 3 shows the dye-sensitized solar cell in Example 1, wherein (A-1) to (E-1) are see-through plan views of the positive electrode side being produced, as viewed from the optical incidence side, (B-2) to (E-2) are see-through plan views of the wiring layers on the back side of the positive electrode board being produced, as viewed from the optical incidence side, (A-2) and (B-3) are section views of (A-1) and (B-1) above, respectively, taken along line #B-#B, and (C-3) to (E-3) are section views of (C-1) to (E-1) above, respectively, taken along line #C-#C.
Figure 4:
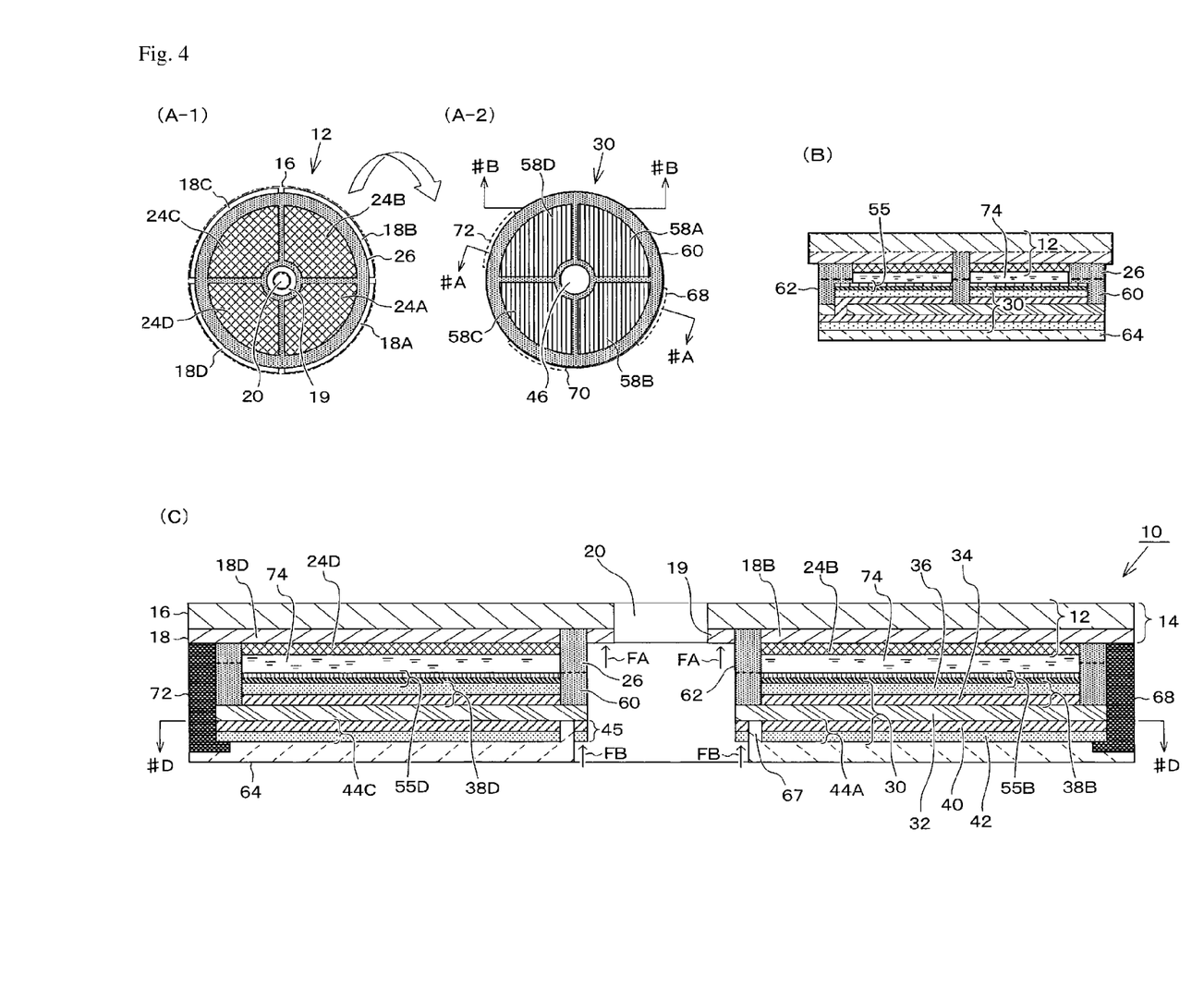
FIG. 4 shows a plan view (A-1) of the negative electrode board and a plan view (A-2) of the positive electrode board illustrating the condition before the negative electrode board and positive electrode board are bonded together, and a key section view (B) of the completed solar cell taken along #B-#B shown in (A-2) and a key section view (C) of the completed solar cell taken along #A-#A shown in (A-2), illustrating the condition after they are bonded together in Example 1.
Figure 5:
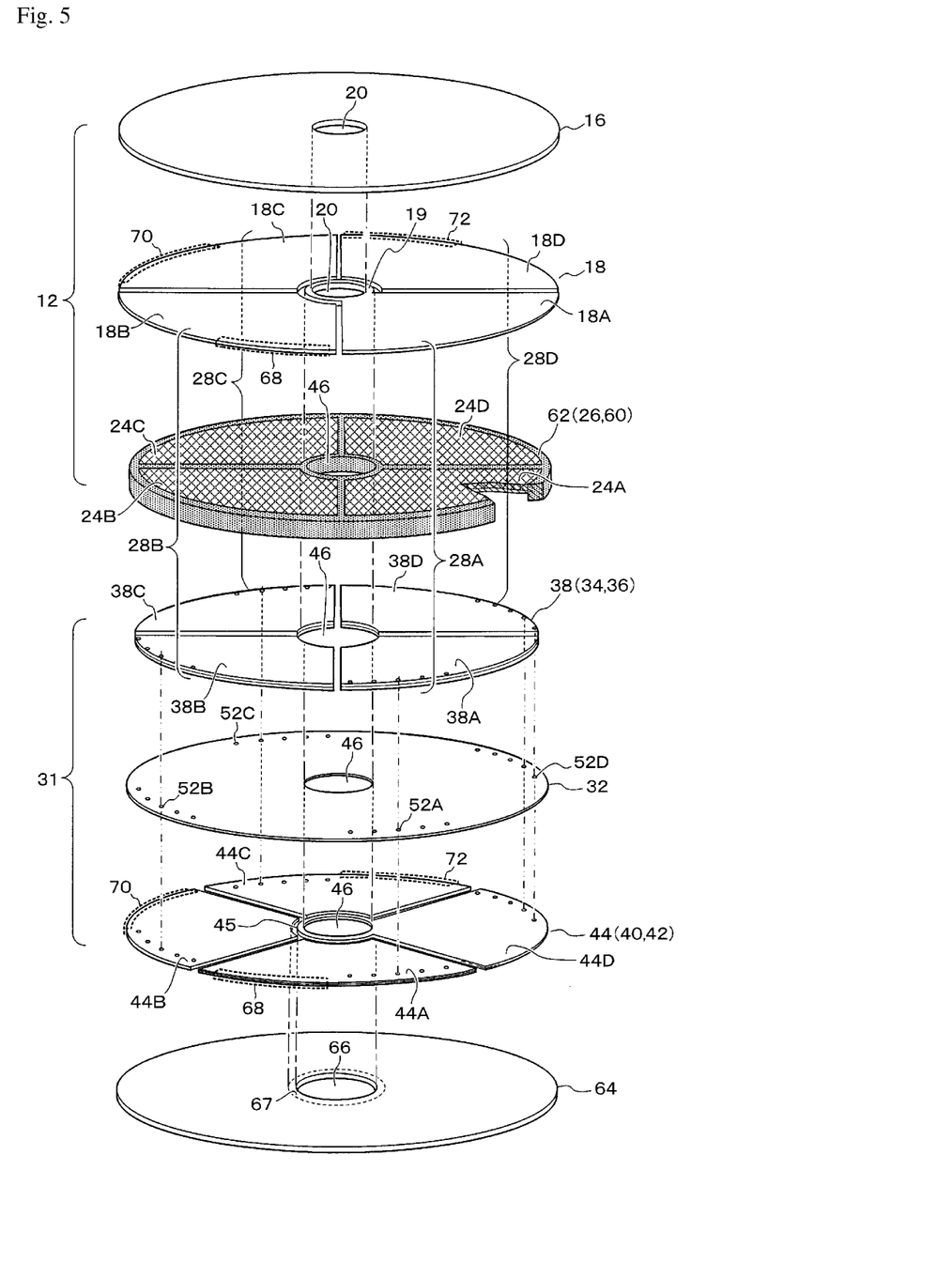
FIG. 5 shows an exploded perspective view illustrating the laminated structure of the solar cell in Example 1.
Figure 6:
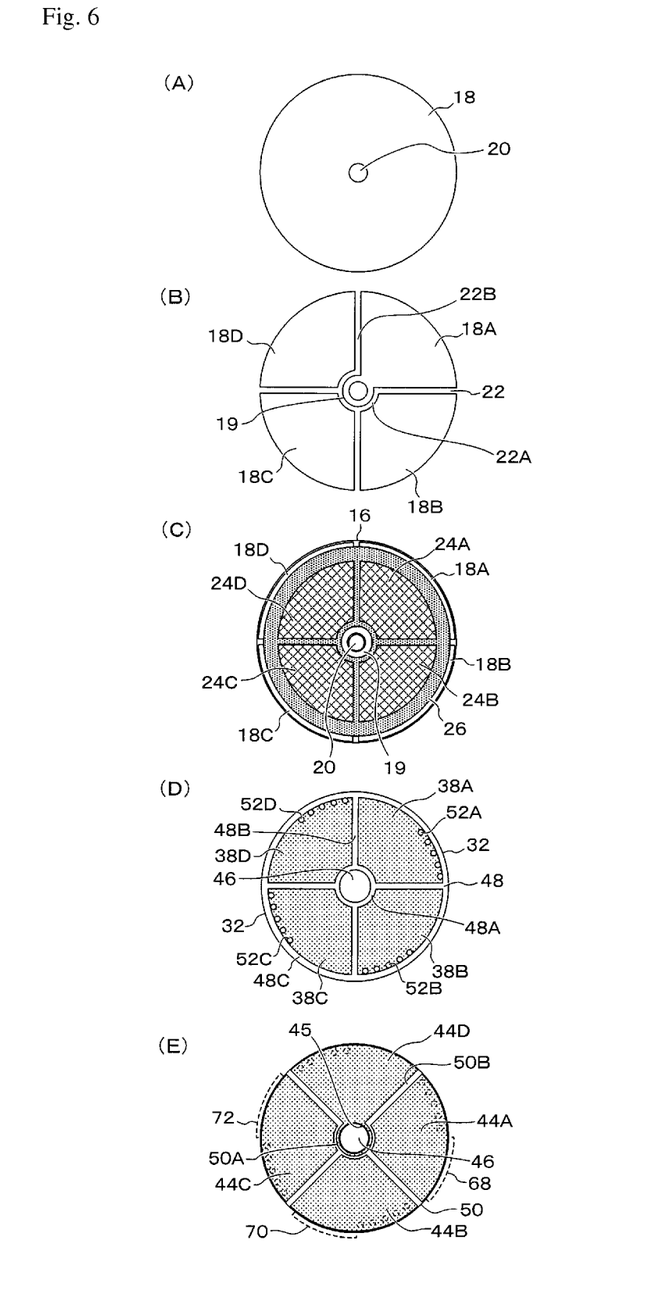
FIG. 6 shows plan views illustrating the layout and connection parts of the clear conductive film (A), the negative electrodes (B), the generation layers (C), the positive electrodes (D), and the wiring layers (E) constituting the solar cell in Example 1.
Figure 7:
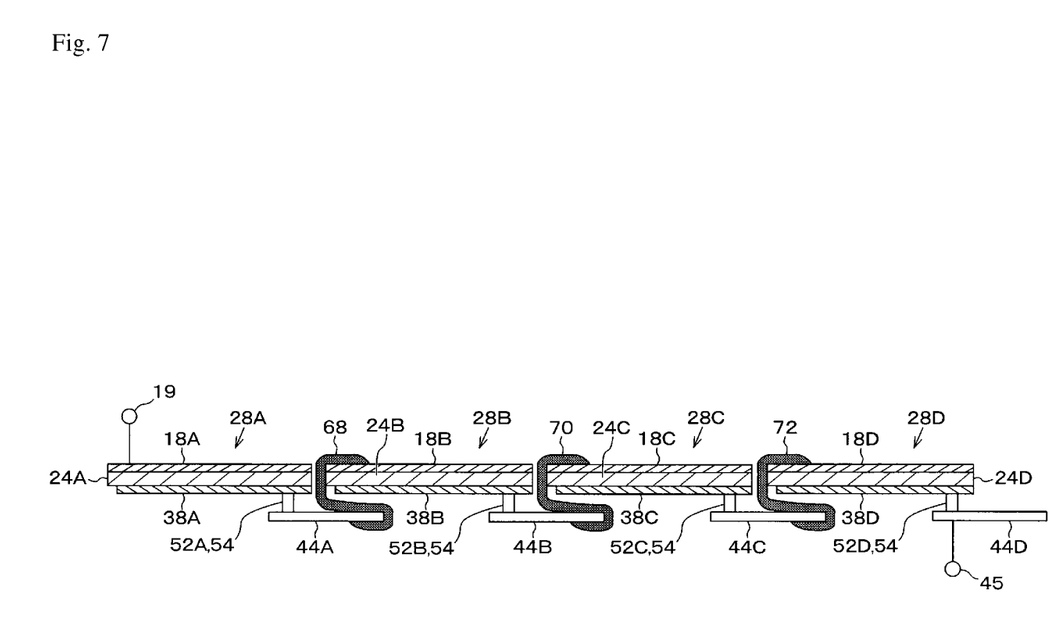
FIG. 7 shows a schematic drawing illustrating the connection structure of four photoelectric conversion elements (generation cells) constituting the solar cell in Example 1.

First, Example 1 of the present invention is explained by referring to FIGS. 1 to 7. In this example, the present invention is applied to a dye-sensitized solar cell that uses a dye-sensitized light generation layer as a generation layer. (A) in FIG. 1 is a plan view of the solar cell in this example as viewed from the optical incidence plane side, (B) in FIG. 1 is a see-through plan view of the wiring layer side of the positive electrode board as viewed from the optical incidence plane side, and (C) in FIG. 1 is a section view of (A) above, cut along line #A-#A and viewed from the direction of the arrow. (B) in FIG. 1 above corresponds to (C) in FIG. 1, cut along line #D-#D and viewed from the direction of the arrow. FIGS. 2 to 4 show the process of producing the solar cell in this example, the details of which are described later. FIG. 5 is an exploded perspective view showing the laminated structure of the solar cell in this example, while FIG. 6 is a plan view showing the layout and connection parts of the negative electrodes, generation layers, positive electrodes and wiring layers constituting the solar cell in this example, as viewed from the optical incidence side. FIG. 7 is a schematic drawing showing the connection structure of four photoelectric conversion elements (generation cells) constituting the solar cell in this example.

First, the structure of the solar cell in this example is explained by referring to FIGS. 1 and 5 to 7. A solar cell 10 in this example is structured in such a way that four generation cells 28A to 28D (refer to FIG. 5) are positioned around the solar cell 10 except for the opening at its approximate center, shaped like a disk as a whole. The four generation cells are connected in series as described later. As shown in (C) in FIG. 1, the solar cell 10 in this example has a constitution where a negative electrode board (or generation board) 12 and positive electrode board (opposing board) 30 are facing each other. Further, an electrolytic solution 74 is sealed in the space formed by a sealant 62 provided around the negative electrode board 12 and positive electrode board 30, and generation layers 24A to 24D provided on the negative electrode board 12 are in contact with the electrolytic solution 74.

The negative electrode board 12 is an approximate circle having a through hole 20 at its approximate center, constituted by a board with clear conductive film 14 and the generation layers 24A to 24D. The board with clear conductive film 14 has a laminated structure comprising a plastic board 16 and a clear conductive film 18 placed thereon (in FIG. 1, the clear conductive film 18 is attached to an undersurface of the plastic board 16). In this example, the plastic board 16 is a PET (polyethylene terephthalate) board or PEN (polyethylene naphthalate) board, while the clear conductive film 18 is a meshed ITO. The clear conductive film 18 is divided into four, as shown in FIG. 5 and (B) in FIG. 6, to constitute a first negative electrode 18A, second negative electrode 18B, third negative electrode 18C, and fourth negative electrode 18D. The first negative electrode 18A has a negative electrode terminal part 19 formed around the through hole 20. The through hole 20 is such that, when the positive electrode board 30 is bonded together with the negative electrode board 12, the periphery of the through hole 20 is exposed without overlapping with the positive electrode board 30, and consequently the negative electrode terminal part 19 is formed at the exposed part and the negative electrodes can be taken out from the approximate center of the solar cell 10 as a result.

As shown in (C) in FIG. 6, the first to fourth generation layers 24A to 24D, each constituted by a porous semiconductor on the center of which a dye is supported, are provided on the first to fourth negative electrodes 18A to 18D. The first to fourth negative electrodes 18A to 18D are insulated from one another by a sealant 26 provided in a division pattern 22, and the first to fourth generation layers 24A to 24D are also insulated from one another by the sealant 26. Details are explained in the manufacturing process later.

Next, the positive electrode board 30 is explained. The positive electrode board 30 is constituted using a laminated printed board 31, and has a through hole 46 at its approximate center whose diameter is greater than that of the through hole 20 in the negative electrode board 12. Also, the positive electrode board 30 has a polyimide layer 32, first to fourth positive electrodes 38A to 38D formed on one main side of it, and first to fourth wiring layers 44A to 44D formed on the other main side of the polyimide layer 32. The side on which the first to fourth wiring layers 44A to 44D are provided represents the non-optical receiving side. Catalyst layers 55A to 55D are provided on the first to fourth positive electrodes 38A to 38D. The printed board 31 has a conductor layer 38 constituted by a thin Cu film 34 and thin Au film 36 on one main side of the polyimide layer 32, and a conductor layer 44 constituted by a thin Cu film 40 and thin Au film 42 on the other main side.

Further, by etching the conductor layer 38 to a specified pattern, four divisions corresponding to the first to fourth positive electrodes 38A to 38D are formed (refer to FIG. 5 and (D) in FIG. 6). These first to fourth positive electrodes 38A to 38D are insulated from one another by a sealant 60. The first to fourth positive electrodes 38A to 38D are formed at positions corresponding to the first to fourth negative electrodes 18A to 18D on the negative electrode board 12. Further, the first negative electrode 18A, first generation layer 24A, and first positive electrode 38A form the first generation cell 28A, as shown in FIG. 5. Similarly, the second negative electrode 18B, second generation layer 24B, and second positive electrode 38B form the second generation cell 28B, the third negative electrode 18C, third generation layer 24C, and third positive electrode 38C form the third generation cell 28C, and the fourth negative electrode 18D, fourth generation layer 24D, and fourth positive electrode 38D form the fourth generation cell 28D.

Also, by etching the conductor layer 44 on the other main side of the polyimide layer 32 to a specified pattern, four divisions corresponding to the first to fourth wiring layers 44A to 44D are formed (refer to (E) in FIG. 6). These first to fourth wiring layers 44A to 44D are insulated from one another by providing a protective layer 64 shown in FIG. 5 on the back side of the wiring layers 44A to 44D, and by also providing a groove (pattern) dividing these layers. The first to fourth wiring layers 44A to 44D correspond to the first to fourth positive electrodes 38A to 38D, but in this example they are formed at positions not matching in the vertical direction and also overlapping with the adjacent positive electrodes as viewed from above. For example, in FIG. 5 the right side of the first wiring layer 44A overlaps with the first positive electrode 38A, while the left side overlaps with the second positive electrode 38B adjacent to the first positive electrode 38A as viewed from above. Basically the same goes with the second through fourth wiring layers 44B to 44D. The fourth wiring layer 44D has a positive electrode terminal part 45 formed around the through hole 46. By forming the positive electrode terminal part 45 around the through hole 46, the positive electrodes can be taken out from the back side of the solar cell 10, or in other words, from the same direction as the negative electrodes.

Next, the structure for connecting the first to fourth generation cells 28A to 28D in series is explained. First, the first to fourth positive electrodes 38A to 38D and first to fourth wiring layers 44A to 44D are electrically connected at the top and bottom of the polyimide layer 32 in between, using through holes 52A to 52D penetrating the polyimide layer 32. The first positive electrode 38A is electrically connected to the first wiring layer 44A by a conductor 54 filled in the multiple (five in the example illustrated) through holes 52A provided on the adjacent second positive electrode 38B side. As mentioned above, the first wiring layer 44A is formed at a position overlapping with both the first positive electrode 38A and second positive electrode 38B, and therefore the connection position of the wiring layer 44A with the first positive electrode 38A is on the adjacent fourth wiring layer 44D side (refer to FIG. 5).

Similarly, the second positive electrode 38B is connected to the second wiring layer 44B by the through holes 52B and conductor 54 provided on the adjacent third positive electrode 38C side. The connection position is closer to the first wiring layer 44A. The third positive electrode 38C is connected to the third wiring layer 44C by the through holes 52C and conductor 54 on the adjacent fourth positive electrode 38D side. The connection position is closer to the second wiring layer 44B. The fourth positive electrode 38D is connected to the fourth wiring layer 44D by the through holes 52D and conductor 54 provided on the adjacent first positive electrode 38A side. The connection position is closer to the third wiring layer 44C. In this example, the through holes 52A to 52D are formed on the outer periphery side. This is to prevent the electric power generation amount from decreasing due to reduction of the catalyst layer area as a result of providing through holes over the entire optical receiving surfaces. Also, while five through holes are provided for each of the through holes 52A to 52D in this example, the number of through holes can be increased or decreased as necessary.

Next, the generation cells 28A to 28D are connected in series on the outer periphery side of the solar cell 10 by utilizing wiring paths 68 to 72. First, the negative electrode 18A of the first generation cell 28A is connected to the exterior by the negative electrode terminal part 19. On the other hand, the positive electrode 38A of the generation cell 28A is connected to the first wiring layer 44A on the back side by the through holes 52A. Further, the wiring path 68 is formed, by applying a conductive paste in the laminating direction, at a position on the outer periphery side of the first wiring layer 44A where none of the through holes 52A is formed, or in other words, at a position overlapping with the second generation cell 28B. The wiring path 68 is connected to the negative electrode 18B of the second generation cell 28B (refer to FIGS. 5 and 7).

The positive electrode 38B of the second generation cell 28B is connected to the second wiring layer 44B on the back side by the through holes 52B. Further, the wiring path 70 constituted by a conductive paste applied in the laminating direction at a position on the outer periphery side of the second wiring layer 44B where none of the through holes 52B is formed, or in other words, at a position overlapping with the third generation cell 28C, is used to connect the second positive electrode 38B to the negative electrode 18C of the third generation cell 28C via the second wiring layer 44B (refer to FIGS. 5 and 7).

The positive electrode 38C of the third generation cell 28C is connected to the third wiring layer 44C on the back side by the through holes 52C. Further, the wiring path 72 constituted by a conductive paste applied in the laminating direction at a position on the outer periphery side of the third wiring layer 44C where none of the through holes 52C is formed, or in other words, at a position overlapping with the fourth generation cell 28C, is used to connect the third positive electrode 38C to the negative electrode 18D of the fourth generation cell 28D via the third wiring layer 44C (refer to FIGS. 5 and 7).

The positive electrode 38D of the fourth generation cell 28D is connected to the fourth wiring layer 44D on the back side by the through holes 52D. The positive electrode terminal part 45 is provided on the wiring layer 44D, and the positive electrodes are taken out via the positive electrode terminal part 45 (refer to FIGS. 5 and 7). This way, the wiring paths 68 to 72 electrically connect the negative electrodes and positive electrodes of adjacent generation cells on the outer periphery side of the solar cell 10, except for the first negative electrode 18A on which the negative electrode terminal part 19 is provided, and the positive electrode 38D connected to the fourth wiring layer 44D on which the positive electrode terminal part 45 is provided. Accordingly, series connection is possible at positions away from the electrolytic solution 74, and this eases the structural problem of corrosion caused by leakage of the electrolytic solution.

Next, the manufacturing method of the solar cell 10 in this example is explained by also referring to FIGS. 2 to 4. FIG. 2 provides a plan view and section view showing the process of producing the negative electrode board 12, while FIG. 3 provides a plan view and section view showing the process of producing the positive electrode board 30. FIG. 4 provides a plan view showing the condition before the negative electrode board and positive electrode board are bonded together, and a key section view of the condition after they are bonded together. First, production of the negative electrode board is explained by referring to FIG. 2. (A-1) to (D-1) in FIG. 2 are see-through plan views of the plastic board showing the electrodes, etc., being produced, as viewed from the optical incidence side. Also, in FIG. 2, (A-2) to (D-2) are section views of the negative electrode board as a whole, corresponding to (A-1) to (D-1) cut along line #B-#B and viewed from the direction of the arrow.

First, a plastic board 16 (PEN, PET, etc.) with clear conductive film 18 formed on it is prepared, and a through hole 20 is formed at its approximate center as shown in (A-1) in FIG. 2. The external dimension of the plastic board 16 is 120 mm, for example, and the diameter of the through hole 20 is 15 mm. Next, as shown in (B-1) and (B-2) in FIG. 2, the clear conductive film 18 is patterned by laser etching. As shown in (B-1) in FIG. 2, the pattern 22 divides the clear conductive film 18 into four to form four negative electrodes 18A to 18D. To be specific, it has an inner periphery part 22A formed in a manner forming the negative electrode terminal part 19 around the through hole 20, and four radial parts 22B formed radially from the inner periphery part 22A toward the outer periphery part. The inner periphery part 22A is not shaped in a complete circle, but is shaped in approximately a three-quarter circle that allows the negative electrode terminal part 19 to be connected to the first negative electrode 18A.

Next, a low-temperature titanium oxide paste is screen-printed onto the negative electrodes 18A to 18D, except for the negative electrode terminal part 19 and outer periphery part, to form one to three layers of film, followed by drying at 80° C. for 10 minutes. Further, a low-temperature titanium oxide paste whose particle size is greater than that of the generation layer is screen-printed to form one optical containment layer of film, followed by drying at 80° C. for 10 minutes. The generation layer and optical containment layer are pressed at 190 MPa on a hydrostatic press and then UV-ozone processed at 70° C. for 30 minutes, after which the layers are soaked in a N719 dye solution at 50° C. for 4 hours to let them adsorb dye. After the adsorption, anhydrous acetonitrile is used to wash away excess dye, followed by indoor drying, to form first to fourth generation layers 24A to 24D. Further, parts where the generation layers 24A to 24D are not formed are washed with ethanol, after which a sealant 26 is applied using a dispenser (refer to (D-1) and (D-2) in FIG. 2).

The sealant 26 is shaped to correspond to the pattern 22, having a circular inner periphery part 26A on the center side, four radial parts 26B formed radially therefrom, and an outer periphery part 26C. The sealant 26 is applied in such a way that the outermost periphery parts of the negative electrodes 18A to 18D are exposed. The sealant 26 is also applied in such a way that it projects from the surfaces of the generation layers 24A to 24D, as shown in (D-2) in FIG. 2. This is to form a space for sealing the electrolytic solution 74 between the generation layer and positive electrode when the positive electrode board 30 described later is bonded together. The negative electrode board 12 is now complete.

Next, the manufacturing method of the positive electrode board 30 is explained by referring to FIG. 3. In FIG. 3, (A-1) to (E-1) are see-through plan views of the positive electrode side being produced, as viewed from the optical incidence side, (B-2) to (E-2) are see-through plan views of the wiring layers on the back side of the positive electrode board being produced, as viewed from the optical incidence side, (A-2) and (B-3) are section views of (A-1) and (B-1) above, respectively, cut along line #B-#B and viewed from the direction of the arrow, and (C-3) to (E-3) are section views of (C-1) to (E-1) above, respectively, cut along line #C-#C and viewed from the direction of the arrow. First, as shown in (A-1) in FIG. 3, a multi-layer printed board 31 is prepared and a through hole 46 is formed at its approximate center. The external dimension of the printed board 31 is 116 to 118 mm, and the diameter of the through hole 46 is 25 mm. As shown in (A-2) in FIG. 3, the printed board 31 is structured in such a way that thin Cu films 34, 40 are formed on the front and back of a polyimide layer 32, and thin Au films 36, 42 are formed on top. For ease of explanation, the thin Cu film 34 and thin Au film 36 on one main side (optical incidence side) of the polyimide layer 32 are hereinafter collectively referred to as a conductor layer 38, while the thin Cu film 40 and thin Au film 42 on the other main side are also collectively referred to as a conductor layer 44.

Next, the conductor layers 38, 44 are patterned by wet etching. As shown in (B-1) in FIG. 3, a pattern 48 is formed to divide the conductor layer 38 side into four to form first to fourth positive electrodes 38A to 38D. The pattern 48 has an inner periphery part 48A formed around the through hole 46, four radial parts 48B formed radially from the inner periphery part 48A toward the outer periphery, and an outer periphery part 48C formed in a manner exposing the outer periphery of the polyimide layer 32. On the other hand, as shown in (B-2) in FIG. 3, a pattern 50 is formed in the conductor layer 44 on the back side to form four divisions corresponding to first to fourth wiring layers 44A to 44D. The pattern 50 has an inner periphery part 50A formed in a manner keeping the positive electrode terminal part 45 around the through hole 46, and four radial parts 50B formed radially from the inner periphery part 50A toward the outer periphery. The inner periphery part 50A is not shaped in a complete ring, but is shaped in approximately a three-quarter circle that allows the positive electrode terminal part 45 to connect to the fourth wiring layer 44D. While the wiring layers 44A to 44D are provided to correspond to the positive electrodes 38A to 38D, in this example the positions of the wiring layers 44A to 44D do not completely match those of the positive electrodes 38A to 38D, but they are formed with an offset of approx. 45° instead.

Next, through holes 52A to 52D are formed for connecting the first to fourth positive electrodes 38A to 38D and first to fourth wiring layers 44A to 44D, and then plated with a conductor 54 on the interior (refer to (C-1) to (C-3) in FIG. 3), to connect the first positive electrode 38A and first wiring layer 44A, second positive electrode 38B and second wiring layer 44B, third positive electrode 38C and third wiring layer 44C, and fourth positive electrode 38D and fourth wiring layer 44D, via the through holes. For example, metal is removed by wet etching from the through-hole forming parts on the positive electrodes 38A to 38D, after which the exposed polyimide layer 32 is punched with a laser to ensure conductivity between the top and bottom of the polyimide layer 32 through electroless plating. Next, catalyst layers 55A to 55D that are to face the titanium dioxide layers of the negative electrodes 18A to 18D are formed on the positive electrodes 38A to 38D. In this example, first the pattern 48 is masked using a removable resin or tape, after which thin Ti films 56A to 56D are formed by sputtering on the positive electrodes 38A to 38D, and then thin Pt films 58A to 58D are formed by sputtering on top (refer to (D-1) and (D-3) in FIG. 3). After the sputtered films have been formed, the masking over the pattern 48 is removed. For ease of explanation, the pairs of thin Ti films 56A to 56D and thin Pt films 58A to 58D are hereinafter collectively referred to as catalyst layers 55A to 55D, respectively.

Further, a sealant 60 is applied, using a dispenser, to the side on which the catalyst layers 55A to 55D have been formed (refer to (E-1) and (E-3) in FIG. 3). The sealant 60 is shaped to correspond to the pattern 48 and has a circular inner periphery part 60A on the center side, four radial parts 60B formed in a manner radiating therefrom, and an outer periphery part 60C. The outer periphery part 60C is preferably formed in a manner covering the through holes 52A to 52D. Also, the sealant 60 is applied in such a way that it projects from the surfaces of the catalyst layers 55A to 55D. This is to form a space for sealing the electrolytic solution 74 between the generation layer and positive electrode when the negative electrode board 12 is bonded together with the positive electrode board 30. The positive electrode board 30 is now complete.

Next, the negative electrode board 12 ((A-1) in FIG. 4) and positive electrode board 30 ((A-2) in FIG. 4) thus formed are bonded together in vacuum, with their respective sealants 26, 60 facing each other and afterward the electrolytic solution 74 is impregnated into the generation layers 24A to 24D of the negative electrodes 18A to 18D. After the bonding, wiring paths 68, 70, 72 are formed on the outer periphery by applying a conductive paste made of silver, etc., at the positions indicated by the dotted lines in (A-2) in FIG. 4, to electrically connect the negative electrodes and wiring layers. The specific connection pattern was already explained above using FIGS. 5 and 7. Thereafter, a protective layer 64 is formed on the wiring layer 44A to 44D side using acrylic resin, etc., by the spin coating method. The protective layer 64 has an opening 66 corresponding to the through hole 46 and is formed in a manner burying the pattern 50 dividing the wiring layers 44A to 44D, where a rim 67 of the opening 66 buries the pattern 50A dividing, and thereby insulating, the positive electrode terminal part 45 and wiring layers 44A to 44C.

The solar cell 10 is now complete. (B) in FIG. 4 is a section view of the completed solar cell 10, cut along line #B-#B shown in (A-2) in FIG. 4 and viewed from the direction of the arrow, while (C) in FIG. 4 is a section view of the same, cut along line #A-#A and viewed from the direction of the arrow. The solar cell 10 has its negative electrode terminal part 19 exposed on the inner periphery side of the opening at its approximate center, with the positive electrode terminal part 45 exposed on the outer periphery side. Accordingly, by connecting the inner periphery side to the negative electrode of a connector not illustrated, as shown in (C) in FIG. 1 by the arrow FA, and also by connecting the outer periphery side to the positive electrode of this connector, as shown by the arrow FB, the electrodes can be taken out. For this connection, the connection structure disclosed in Japanese Patent Laid-open No. 2012-134451 can be utilized, for example. These solar cells 10 are arranged on a panel, etc., having multiple aforementioned connectors, as necessary.

Therefore, according to Example 1, in a dye-sensitized solar cell having multiple photoelectric conversion elements, each constituted by a negative electrode on which a generation layer is provided and by an opposing positive electrode, with an electrolytic solution sealed in the space formed by a sealant provided around them, a wiring layer corresponding to the positive electrode is formed on the other main side of the insulation layer on which the positive electrode is formed, so as to connect the positive electrode by the first electrode coupling means. Also, the negative electrode of a photoelectric conversion element, and the wiring layer connected to the positive electrode of an adjacent photoelectric conversion element, are connected by the second electrode coupling means on the outer periphery side of the cell. This provides the following effects:

1) The structure where the generation cells 28A to 28D are connected in series on the outer periphery side of the solar cell reduces the negative effect of leakage of the electrolytic solution 74, and consequently the possibility of the electrical connection parts (wiring paths 68 to 72) corroding due to contact with iodine included in the electrolytic solution 74 can be kept to a minimum. As a result, low resistance can be achieved by forming the wiring paths 68 to 72 using a paste of silver or other metal that is highly corrosive to iodine, and because this increases the outputs from the individual generation cells 28A to 28D, the output voltage of the entire solar cell 10 connecting these generation cells 28A to 28D can be kept high.

2) Since the through holes connecting the positive electrodes 38A to 38D and wiring layers 44A to 44D are formed on the outer periphery side, electrical connection can be implemented without reducing the optical receiving area.

3) Since the positions of the positive electrodes 38A to 38D are offset from those of the wiring layers 44A to 44D, there is no need to form thin leader wires as is the case in Example 2 described later and therefore the resistance does not increase, meaning that the multiple generation cells 28A to 28D can be connected in the same manner and consequently stable output is achieved.

4) Since a net-like meshed electrode is used for the clear conductive film 18, increasing the area does not cause the generation efficiency to drop (or the resistance to increase). In other words, while it was difficult to increase the area per generation cell under prior arts, the present invention uses a meshed electrode to lower the planar resistance, thus making it possible to achieve a certain level of generation efficiency even when solid generation layers 24A to 24D are formed.

5) Since the solar cell 10 is an optical disk type, its portability is high and multiple cells can be combined into a panel, etc., with ease.

EXAMPLE 2

Figure 8:
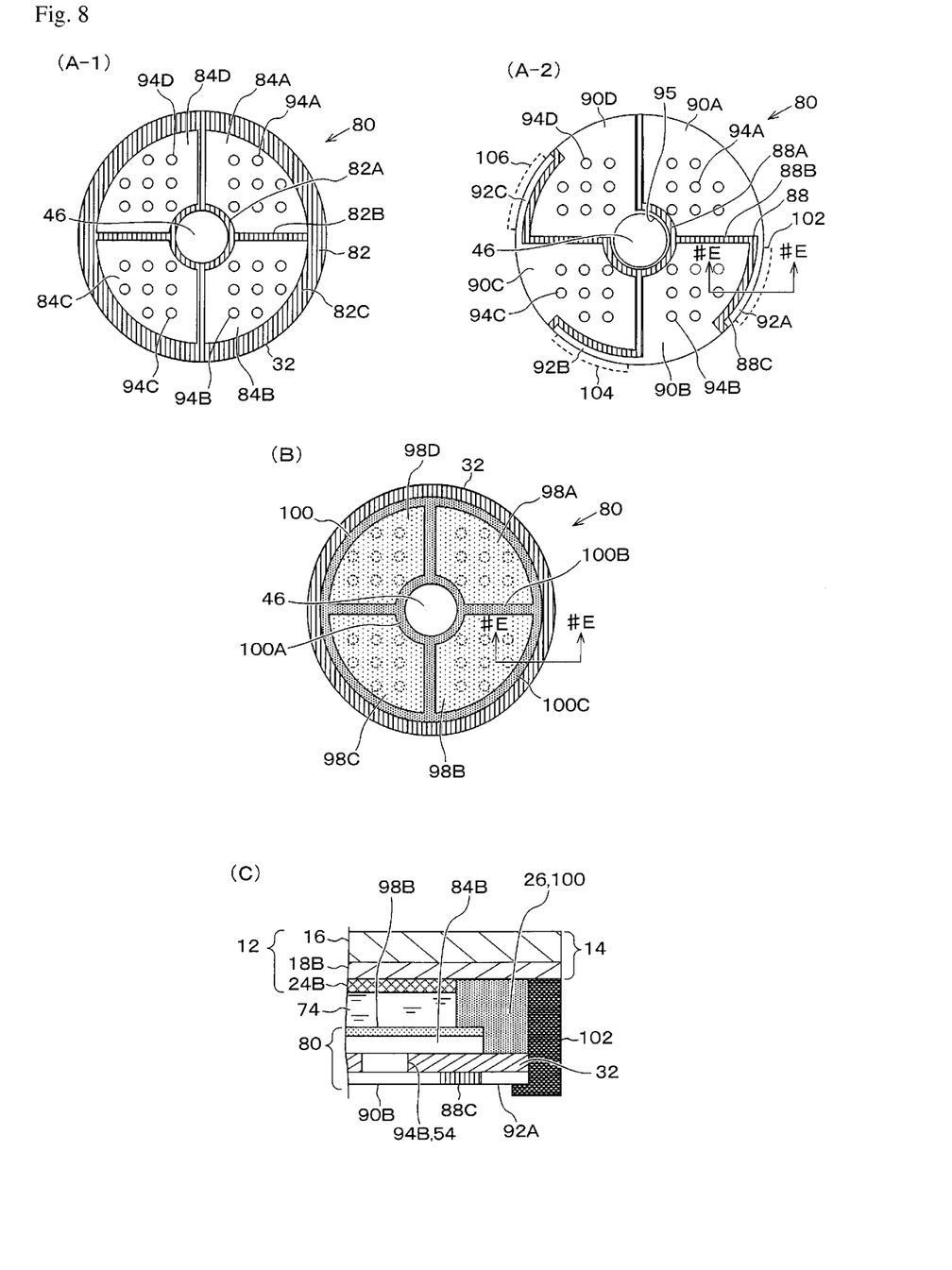
FIG. 8 shows the positive electrode board being produced in Example 2 of the present invention, where (A-1), (A-2), and (B) are plan views illustrating the positive electrode board being produced, while (C) is a section view of the completed solar cell in (A-2) and (B), taken along line #E-#E shown in (B).

Next, Example 2 of the present invention is explained by referring to FIG. 8. Note that those components that are identical or correspond to the applicable components in Example 1 described above are denoted by the same symbols. The constitution of Example 1 above are such that the positive electrodes and generation layers are formed at offset positions and the connection through holes are provided on the outer periphery; in this example, on the other hand, the positions of the positive electrodes are roughly matched with those of the generation layers at the top and bottom of the insulation layer in between, and through holes are formed over the entire surface. (A-1) and (B) in FIG. 8 are see-through plan views of the positive electrode side of the positive electrode board being produced, as viewed from the optical incidence side, (A-2) in FIG. 8 is a see-through plan view of the wiring layer side of the positive electrode board being produced, as viewed from the optical incidence side, and (C) in FIG. 8 is a section view of (A-2) and (B) in FIG. 8, cut along line #E-#E and viewed from the direction of the arrow.

In this example, the structure and manufacturing method of the negative electrode board 12 are the same as those in Example 1, and therefore only the manufacturing method of a positive electrode board 80 is explained by referring to FIG. 8. A multi-layer printed board 31 is prepared and a through hole 46 is formed at its approximate center, in the same way as in Example 1. Next, the conductor layers on both main sides of the polyimide layer 32 are patterned by wet etching. As shown in (A-1) in FIG. 8, a pattern 82 is formed in the conductor layer on the optical incidence side to form four divisions corresponding to first to fourth positive electrodes 84A to 84D. The pattern 82 has an inner periphery part 82A formed around the through hole 46, four radial parts 82B formed radially from the inner periphery part 82A toward the outer periphery, and an outer periphery part 82C formed around the outer periphery in a manner exposing the outer periphery of the polyimide layer 32.

On the other hand, as shown in (A-2) in FIG. 8, a pattern 88 is formed in the conductor layer on the back side of the polyimide layer 32 to form four divisions corresponding to first to fourth wiring layers 90A to 90D. The pattern 88 has an inner periphery part 88A formed in a manner keeping a positive electrode terminal part 95 around the through hole 46, four radial parts 88B formed radially from the inner periphery part 88A toward the outer periphery, and three outer periphery parts 88C formed along the outer periphery from the tips of the radial parts 88B. The outer periphery parts 88C are formed in such a way that the first to third wiring layers 90A to 90C have leader parts 92A to 92C on the outer periphery sides of the adjacent second to fourth wiring layers 90B to 90D. In this example, the positions of the positive electrodes 84A to 84D correspond for the most part to the positions of the wiring layers 90A to 90D, as shown in (A-1) and (A-2) in FIG. 8.

Next, through holes 94A to 94D for connecting the first to fourth positive electrodes 84A to 84D and first to fourth wiring layers 90A to 90D are formed, and then plated with the conductor 54 on the interior, to connect the first to fourth positive electrodes 84A to 84D and first to fourth wiring layers 90A to 90D via the through holes, at the top and bottom of the polyimide layer 32 in between. Unlike in Example 1, the through holes 94A to 94D are provided over the entire surface in multiple quantities, not in the outer periphery part. Next, catalyst layers 98A to 98D that are to face the titanium dioxide layers of the negative electrodes 18A to 18D are formed on the positive electrodes 84A to 84D ((B) in FIG. 8). Further, a sealant 100 is applied, using a dispenser, to the side on which the catalyst layers 98A to 98D are formed ((B) in FIG. 8). The sealant 100 is shaped to correspond to the pattern 88 and has a circular inner periphery part 100A on the center side, four radial parts 100B formed radially therefrom, and an outer periphery part 100C. The outer periphery part 100C is applied in a manner exposing the outer periphery part of the polyimide layer 32. The sealant 100 is also applied in a manner projecting from the surfaces of the catalyst layer 98A to 98D. This is to form a space for sealing the electrolytic solution 74 between the generation layer and positive electrode when the negative electrode board 12 is bonded together with the positive electrode board 30. The positive electrode board 80 is now complete.

Next, the positive electrode board 80 thus formed is bonded together with the negative electrode board 12 formed in the same manner as in Example 1, with their respective sealants 100, 26 facing each other, to seal the electrolytic solution 74. After the bonding, a conductive paste made of silver, etc., is applied to the positions indicated by the dotted lines in (A-2) in FIG. 8 to form three wiring paths 102, 104, 106 in the outer periphery part and electrically connect the negative electrodes of the adjacent generation cells and the wiring layers. For example, the wiring path 102 is such that, as shown in the section view in (C) in FIG. 8, the leader part 92A of the first wiring layer 90A formed on the back side of the positive electrode board 80 is electrically connected to the second negative electrode 18B on the negative electrode board 12 by the wiring path 102. In other words, the first wiring layer 90A connected to the positive electrode 84A of the first generation cell via the through hole 94A and conductor 54 is electrically connected to the negative electrode 18B of the adjacent second generation cell on the outer periphery side, by the wiring path 102 and leader part 92A. The same goes with the connections by the other wiring paths 104, 106. Thereafter, a protective layer 64 similar to the one in Example 1 is formed on the wiring layer 90A to 90D side using acrylic resin, etc., by the spin coating method.

The dye-sensitized solar cell produced in this example was irradiated with simulated solar light of AM1.5, and Jsc, Voc, FF and EFF of each photoelectric conversion element were measured, during the irradiation, using an IV measuring system. As a result, Voc was 2.2 V, indicating a substantial improvement in the output voltage of one optical disk DSC. Although this example pertains to a structure where four cells are connected in series, the number of series connections can be increased according to the device to increase the output voltage further.

The basic operations/effects of this example are similar to those of Example 1 above. Even when the problem of corrosion due to leakage of the electrolytic solution 74 is absent, through holes can be provided over the entire surface, as is the case in this example, if the optical receiving area is increased and large current flows as a result, because the through holes provide resistance and consequently the resistance between the electrodes on top and bottom of the polyimide layer 32 (between the positive electrode and wiring layer) decreases. The longer the distance over which the electrolytic solution 74 flows on the surface of the positive electrode it contacts, the higher the possibility of electrons being trapped by the electrolytic solution 74 becomes. Accordingly, the through holes provided over the entire surface provide an advantage in that electrons can be quickly guided to the back side to increase the current takeout efficiency.

It should be noted that the present invention is not at all limited to the examples described above, and various changes can be added to the extent that they do not deviate from the purpose of the present invention. For example, the present invention also includes the following:

1) The negative electrode, generation layer and wiring layer were divided into four, respectively, in the examples above, but this is only one example and they can be divided into two, three, or more than four.

2) The adjacent negative electrodes, generation layers and wiring layers had roughly the same shapes in the examples above, but this is only one example and their shapes can be changed as deemed appropriate if necessary. However, using identical or symmetrical shapes provides an advantage in that the distances from the generation locations to the takeout locations become roughly equivalent, which in turn prevents the output from varying.

3) The shape of the solar cell 10 itself and of the through hole at its center is only one example, and the shape is not at all limited to circle, but it can be square.

4) The through-hole connection positions shown in the examples above are only one example and the designs can be changed as deemed appropriate to the extent that similar effects are achieved. The same goes with the wiring-path connection positions on the outer periphery side, and these positions can be changed as deemed appropriate, so long as they remain on the outer periphery side, according to the layout and shapes of the negative electrodes, positive electrodes, and wiring layers.

5) The clear electrode (negative electrode) was a net-like meshed electrode in Example 1 above, but this is only one example and it can be changed as deemed appropriate if necessary.

INDUSTRIAL FIELD OF APPLICATION

According to the present invention, multiple photoelectric conversion elements are provided, each constituted by a negative electrode on which a generation layer is provided and by an opposing positive electrode, with an electrolytic solution sealed in the space formed by a sealant provided around them, where a wiring layer corresponding to the positive electrode is formed on the other main side of the insulation layer on which the positive electrode is formed, so as to connect the positive electrode by the first electrode coupling means. Also, the negative electrode of a photoelectric conversion element, and the wiring layer connected to the positive electrode of an adjacent photoelectric conversion element, are connected by the second electrode coupling means on the outer periphery side. Such electrical connection structure keeps to a minimum the problem of corrosion caused by leakage of the electrolytic solution, and therefore low resistance can be achieved by implementing electrical connection using a paste of silver or other metal that is highly corrosive to iodine, and the overall output voltage can be kept high as a result, which makes it possible to apply the present invention to dye-sensitized solar cell applications. In particular, it can be applied favorably to independent power supply applications where a dye-sensitized solar cell is combined with a capacitor or other secondary cell.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, an article "a" or "an" may refer to a species or a genus including multiple species, and "the invention" or "the present invention" may refer to at least one of the embodiments or aspects explicitly, necessarily, or inherently disclosed herein. Further, in this disclosure, the term "connected" refers to a physical connection or contact, direct connection, indirect connection, and/or electrical connection, depending on the context. In this disclosure, any defined meanings do not necessarily exclude ordinary and customary meanings in some embodiments.

The present application claims priority to Japanese Patent Application No. 2012-219523, filed Oct. 1, 2012, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A dye-sensitized solar cell having multiple photoelectric conversion elements, where each element has a negative electrode on which a dye-sensitized generation layer is provided, as well as a positive electrode opposingly positioned in a manner sandwiching the generation layer, and an electrolytic solution is sealed in a space formed by a sealant provided around the negative electrode and positive electrode; wherein:
the multiple photoelectric conversion elements are positioned around the dye-sensitized solar cell except at its approximate center;
multiple wiring layers corresponding to the positive electrodes of multiple photoelectric conversion elements are positioned, via an insulation layer, on a non-optical receiving side of the dye-sensitized solar cell; and
the dye-sensitized solar cell comprises:
a negative electrode terminal part which is connected to the negative electrode of one of the multiple photoelectric conversion elements and used for taking out the electrodes at the approximate center;
a first electrode coupling means for electrically connecting the positive electrode and corresponding wiring layer;
a positive electrode terminal part which is formed on the wiring layer connected to the positive electrode of another element among the multiple photoelectric conversion elements other than the one of the multiple photoelectric conversion elements and which is used for taking out the electrodes at the approximate center; and
a second electrode coupling means for connecting adjacent photoelectric conversion elements by electrically connecting the negative electrode of an element on which the negative electrode terminal part is not provided, with a wiring layer on which the positive electrode terminal part is not provided, on an outer periphery side of the dye-sensitized solar cell, wherein the wiring layer is formed at a position overlapping as viewed from above, via the insulation layer, with both the positive electrode of the corresponding photoelectric conversion element and the positive electrode of another photoelectric conversion element adjacent to the corresponding photoelectric conversion element.

2. A dye-sensitized solar cell according to claim 1, wherein:
the first electrode coupling means is provided in a range where the wiring layer overlaps as viewed from above with the positive electrode of the corresponding photoelectric conversion element; and
the second electrode coupling means is connected to the negative electrode of the adjacent photoelectric conversion element, on an outer periphery side, in a range where the wiring layer overlaps as viewed from above with the positive electrode of the adjacent photoelectric conversion element.

3. A dye-sensitized solar cell according to claim 1, wherein the first electrode coupling means is a conductive path formed in a hole that penetrates through the insulation layer from the positive electrode to the wiring layer corresponding to the positive electrode.

4. A dye-sensitized solar cell according to claim 2, wherein the first electrode coupling means is a conductive path formed in a hole that penetrates through the insulation layer from the positive electrode to the wiring layer corresponding to the positive electrode.

5. A dye-sensitized solar cell according to claim 3, wherein the first electrode coupling means is provided on an outer periphery side of the dye-sensitized solar cell.

6. A dye-sensitized solar cell according to claim 4, wherein the first electrode coupling means is provided on an outer periphery side of the dye-sensitized solar cell.

7. A dye-sensitized solar cell according to claim 1, wherein the second electrode coupling means is a conductive path formed by a conductive paste.

8. A dye-sensitized solar cell according to claim 2, wherein the second electrode coupling means is a conductive path formed by a conductive paste.

9. A dye-sensitized solar cell according to claim 3, wherein the second electrode coupling means is a conductive path formed by a conductive paste.

10. A dye-sensitized solar cell according to claim 4, wherein the second electrode coupling means is a conductive path formed by a conductive paste.

11. A dye-sensitized solar cell according to claim 5, wherein the second electrode coupling means is a conductive path formed by a conductive paste.

12. A dye-sensitized solar cell according to claim 6, wherein the second electrode coupling means is a conductive path formed by a conductive paste.

13. A dye-sensitized solar cell according to claim 1, wherein:
- the negative electrodes of the multiple photoelectric conversion elements are respectively formed around a first through hole on one main side of an optically transparent board having the first through hole at its approximate center;
- the insulation layer has, at its approximate center, a second through hole whose diameter is greater than that of the first through hole, where the positive electrodes of the multiple photoelectric conversion elements are respectively formed on one main side, while the multiple wiring layers corresponding to the positive electrodes are formed on the other main side;
- peripheries of the first and second through holes are exposed without overlapping as viewed from above with the generation layer, respectively; and
- the negative electrode terminal part is formed around the first through hole, while the positive electrode terminal part is formed around the second through hole, so that the negative electrodes and positive electrodes are taken out in a same direction from the approximate center.

14. A dye-sensitized solar cell according to claim 2, wherein:
- the negative electrodes of the multiple photoelectric conversion elements are respectively formed around a first through hole on one main side of an optically transparent board having the first through hole at its approximate center;
- the insulation layer has, at its approximate center, a second through hole whose diameter is greater than that of the first through hole, where the positive electrodes of the multiple photoelectric conversion elements are respectively formed on one main side, while the multiple wiring layers corresponding to the positive electrodes are formed on the other main side;
- peripheries of the first and second through holes are exposed without overlapping as viewed from above with the generation layer, respectively; and
- the negative electrode terminal part is formed around the first through hole, while the positive electrode terminal part is formed around the second through hole, so that the negative electrodes and positive electrodes are taken out in a same direction from the approximate center.

15. A dye-sensitized solar cell according to claim 3, wherein:
- the negative electrodes of the multiple photoelectric conversion elements are respectively formed around a first through hole on one main side of an optically transparent board having the first through hole at its approximate center;
- the insulation layer has, at its approximate center, a second through hole whose diameter is greater than that of the first through hole, where the positive electrodes of the multiple photoelectric conversion elements are respectively formed on one main side, while the multiple wiring layers corresponding to the positive electrodes are formed on the other main side;
- peripheries of the first and second through holes are exposed without overlapping as viewed from above with the generation layer, respectively; and
- the negative electrode terminal part is formed around the first through hole, while the positive electrode terminal part is formed around the second through hole, so that the negative electrodes and positive electrodes are taken out in a same direction from the approximate center.

16. A dye-sensitized solar cell according to claim 5, wherein:
- the negative electrodes of the multiple photoelectric conversion elements are respectively formed around a first through hole on one main side of an optically transparent board having the first through hole at its approximate center;
- the insulation layer has, at its approximate center, a second through hole whose diameter is greater than that of the first through hole, where the positive electrodes of the multiple photoelectric conversion elements are respectively formed on one main side, while the multiple wiring layers corresponding to the positive electrodes are formed on the other main side;
- peripheries of the first and second through holes are exposed without overlapping as viewed from above with the generation layer, respectively; and
- the negative electrode terminal part is formed around the first through hole, while the positive electrode terminal part is formed around the second through hole, so that the negative electrodes and positive electrodes are taken out in a same direction from the approximate center.

17. A dye-sensitized solar cell according to claim 7, wherein:
- the negative electrodes of the multiple photoelectric conversion elements are respectively formed around a first through hole on one main side of an optically transparent board having the first through hole at its approximate center;
- the insulation layer has, at its approximate center, a second through hole whose diameter is greater than that of the first through hole, where the positive electrodes of the multiple photoelectric conversion elements are respectively formed on one main side, while the multiple wiring layers corresponding to the positive electrodes are formed on the other main side;
- peripheries of the first and second through holes are exposed without overlapping as viewed from above with the generation layer, respectively; and
- the negative electrode terminal part is formed around the first through hole, while the positive electrode terminal part is formed around the second through hole, so that the negative electrodes and positive electrodes are taken out in a same direction from the approximate center.

18. A dye-sensitized solar cell according to claim 1, wherein the negative electrode is a net-like electrode.

19. A dye-sensitized solar cell according to claim 2, wherein the negative electrode is a net-like electrode.

20. A dye-sensitized solar cell according to claim 3, wherein the negative electrode is a net-like electrode.

* * * * *